(12) United States Patent
Park et al.

(10) Patent No.: US 8,553,170 B2
(45) Date of Patent: Oct. 8, 2013

(54) LIQUID CRYSTAL DISPLAY WITH LIGHT EMITTING DIODE BACKLIGHT ASSEMBLY AND LIQUID CRYSTAL DISPLAY THEREOF

(75) Inventors: Jin-Hee Park, Cheonan-si (KR); Yong-Woo Lee, Suwon-si (KR); Won-Ju Kim, Asan-si (KR); Yong-Il Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 451 days.

(21) Appl. No.: 12/419,376

(22) Filed: Apr. 7, 2009

(65) Prior Publication Data

US 2010/0039579 A1 Feb. 18, 2010

(30) Foreign Application Priority Data

Aug. 12, 2008 (KR) .................................. 2008-78899

(51) Int. Cl.
- *G02F 1/1333* (2006.01)
- *G09F 13/04* (2006.01)
- *F21V 7/00* (2006.01)
- *F21V 21/00* (2006.01)

(52) U.S. Cl.
USPC ........ 349/58; 362/97.3; 362/247; 362/249.06

(58) Field of Classification Search
USPC .................... 349/58; 362/97.3, 247, 249.06
See application file for complete search history.

(56) References Cited

U.S. PATENT DOCUMENTS

| | | | |
|---|---|---|---|
| 2003/0142487 A1* | 7/2003 | Fan | 362/29 |
| 2004/0130538 A1* | 7/2004 | Lin | 345/178 |
| 2005/0265051 A1 | 12/2005 | Yamamoto et al. | |
| 2007/0002590 A1* | 1/2007 | Jang et al. | 362/633 |
| 2008/0252808 A1* | 10/2008 | Chang | 349/58 |
| 2009/0051293 A1* | 2/2009 | Houdek et al. | 315/32 |

FOREIGN PATENT DOCUMENTS

| | | |
|---|---|---|
| CN | 1702521 A | 11/2005 |
| CN | 101109871 A | 1/2008 |
| EP | 1 881 362 A1 | 1/2008 |
| EP | 2 090 924 A2 | 8/2009 |
| JP | 2002 049036 A | 2/2002 |
| JP | 2005339881 A | 12/2005 |
| JP | 2006285181 A | 10/2006 |
| JP | 2007036132 A | 2/2007 |
| JP | 2010501980 A | 1/2010 |
| KR | 1020060007517 A | 1/2006 |
| KR | 20080011895 A | 2/2008 |
| WO | 2008023893 A1 | 2/2008 |

OTHER PUBLICATIONS

European Search Report for Application No. 09004625.1-2205/2154564 dated Mar. 31, 2010.
Partial European Search Report for Application No. 09004625.1-2205 dated Dec. 4, 2009.

\* cited by examiner

*Primary Examiner* — Mark Robinson
*Assistant Examiner* — Jerry Blevins
(74) *Attorney, Agent, or Firm* — Cantor Colburn LLP

(57) ABSTRACT

A light emitting diode ("LED") backlight assembly. The LED backlight assembly has a bottom container which has a bottom plate and a side edge surrounding the bottom plate, a plurality of light emitting diode printed circuit boards ("LED-PCBs") on the bottom plate, and a connector which is closely located to edge located LEDs. The connector of the LED-PCB is closely located to an LED driving board, which is disposed at a lateral space of a lateral part of the bottom container to limit a vertical thickness of the backlight light assembly.

22 Claims, 12 Drawing Sheets

LIQUID CRYSTAL DISPLAY WITH LIGHT EMITTING DIODE BACKLIGHT ASSEMBLY AND LIQUID CRYSTAL DISPLAY THEREOF

This application claims priority to Korean patent Application No. 2008-78899, filed on Aug. 12, 2008, and all the benefits accruing therefrom under 35 U.S.C. §119, the contents of which in its entirety are herein incorporated by reference.

BACKGROUND OF THE INVENTION (1) Field of the Invention

This disclosure relates to a liquid crystal display ("LCD") with a light emitting diode ("LED") backlight assembly, and more particularly, to the LED backlight assembly having an LED driving board disposed at a lateral part of a bottom container of the LED backlight assembly.

(2) Description of the Related Art

As display devices are used in everyday life, the liquid crystal display ("LCD") has been gaining in popularity. To display an image, the LCD has both a liquid crystal ("LC") panel and a backlight assembly The backlight assembly emits light, while the LC panel receives the light from the backlight assembly and displays an image by selectively allowing light from the backlight assembly to pass through the LC panel.

A commercially available light source includes a cold cathode fluorescent lamp ("CCFL"), which has a glass tube and a pair of electrodes at both sides thereof. Another type of light source is a light emitting diode (LED), which has been gaining popularity because the LED is superior to a CCFL in reproducing color and consumes less electricity.

An LED backlight assembly can have a plurality of LEDs mounted on a printed circuit board ("PCB"), hereinafter termed an "LED-PCB", to give sufficient light to the LC panel. In further detail, on an LED-PCB, one LED is separated from a contiguous LED with a gap which is a function of the luminance of each LED. In the same manner, the LEDs are distributed across the whole LED-PCB. Further, since each LED is electrically driven, an electrical connector, hereinafter an LED-PCB connector, is located beyond an edge LED by a distance longer than a gap between LEDs to give enough luminance at the edge area of the LED-PCB.

In addition, a bottom container with a bottom plane is provided to accommodate the LED-PCB. Specifically, the bottom plane of the bottom container supports the LED-PCB with its inner side whereas an LED driving board is supported by an outer side of the bottom plane. Here, the LED driving board receives a signal from an outer device and exports a transformed signal to the LED-PCB.

The LED driving board is separated from the LED-PCB by the bottom plane of the bottom container and is connected to the LED-PCB by a cable which passes through a through-hole. In further detail, the through-hole is formed at either the bottom plane or a side wall of the bottom container to provide a passage for the cable whose ends are connected to a LED-PCB connector and an LED driving board connector, respectively Thus the LED-PCB connector is located near the side wall of the bottom container so as not to reduce the luminance uniformity; and the LED driving board connector is located on one edge of the LED driving board. Since the LED driving board is fixed on a different side from the LED-PCB, the cable is very lengthy and its connection to both the LED driving board and LED-PCB is very difficult.

Still further, the edge and outwardly located LED-PCB connector makes the backlight assembly and the LCD bulky, especially in a top plan plane view. Here, an additional side mold can be introduced at the inner side of the side wall of the bottom container to hide the connector, however by hiding the structure, the plane of the backlight assembly and the LCD is increased.

Furthermore, since the LED driving board is fixed to the outer surface of the bottom plane, and electrical parts, such as resisters, capacitors and integrated circuits ("ICs") on the LED driving boards are outwardly extended from the bottom plane, the thickness of the backlight assembly is increased.

BRIEF SUMMARY OF THE INVENTION

Thus, it is an aspect of the disclosure to provide an improve LED backlight assembly wherein the location of the LED-PCB connector, location of the LED driving board, and structure of the bottom frame are designed to make the LCD compact and easy to assemble.

According to an embodiment, a light emitting diode printed circuit board has a plurality of light emitting diodes having a gap between themselves which is selected to have enough luminance and uniformity thereof. To supply electricity to each of the light emitting diodes, a light emitting diode printed circuit board connector is located at an end of the light emitting diode printed circuit board in the vicinity of an edge located light emitting diode of the light emitting diode array of the light emitting diode printed circuit board. Thus, a distance between the light emitting diode printed circuit board connector and the edge located light emitting diode is shorter than the gap between neighboring light emitting diodes; further, the light emitting diode printed circuit board connector may be between two contiguous edge located light emitting diodes.

Disclosed herein is a light emitting diode printed circuit board, including: a printed circuit board, a plurality of light emitting diodes mounted on the printed circuit board, wherein at least two of the plurality of the light emitting diodes are contiguous and are spaced apart by a first gap, a light emitting diode printed circuit board connector mounted on the printed circuit board, wherein the light emitting diode printed circuit board connector is spaced apart from at least one of the plurality of light emitting diodes by a distance less than the first gap, and an electrical pattern embedded in the printed circuit board, the electrical pattern electrically connecting the light emitting diode printed circuit board connector and the plurality of light emitting diodes.

Also disclosed is a backlight assembly, a bottom container including a bottom plate and a side edge surrounding the bottom plate; a light emitting diode printed circuit board mounted on the bottom plate, the light emitting diode printed circuit board including a plurality of light emitting diodes and a light emitting diode printed circuit board connector; a light emitting diode driving board including a light emitting diode driving board connector; and a signal transmitting cable including a first end and a second end, the signal transmitting cable electrically connecting the light emitting diode driving board connector and the light emitting diode printed circuit board connector, wherein at least one side edge is a lateral part including a lateral space and wherein the light emitting diode driving board is disposed in the lateral space.

Also disclosed is a liquid crystal display including: a backlight assembly including a bottom container, a plurality of light emitting diode printed circuit boards, and a light emitting diode driving board, the bottom container including a lateral part, the lateral part including a lateral space, wherein the light emitting diode driving board is mounted within the lateral space; a liquid crystal panel mounted over the plurality of light emitting diode printed circuit boards, wherein an edge of the liquid crystal panel is mounted over the lateral part of the backlight assembly; and a top frame, the top frame including an upper part encompassing a plurality of edges of the liquid crystal panel, wherein a side part is overlapped with a side of the lateral part of the bottom container, and wherein each of the light emitting diode printed circuit boards includes a plurality of light emitting diodes and a light emitting diode printed circuit board connector, wherein both of the light emitting diodes and the light emitting diode printed circuit board connector are within a luminance active area which overlaps the liquid crystal panel.

Also disclosed is a method of manufacturing a backlight assembly, including: placing a bottom container, the bottom container including a bottom plate and a lateral part, the lateral part including a slope, a flat plate and a vertical plate, the lateral part including a lateral space defined by the slope, the flat plate and the vertical plate; mounting a plurality of light emitting diode printed circuit boards on the bottom plate of the bottom container, each of the light emitting diode printed circuit boards including a plurality of light emitting diodes and a light emitting diode printed circuit board connector, the plurality of light emitting diodes including an edge located light emitting diode, the light emitting diode printed circuit board connector located close to an edge located light emitting diode; combining a light emitting diode driving board with a shield, the light emitting diode driving board providing an electric signal to the light emitting diode printed circuit boards, wherein the shield shields electromagnetic radiation from the light emitting diode driving board, the light emitting diode driving board including a light emitting diode driving board connector, disposing the combined light emitting diode driving board and shield at the lateral space, mounting the combined light emitting diode driving board and shield on the bottom container with the shield; and connecting a light emitting diode printed circuit board connector and the light emitting diode driving board connector with a signal transmitting cable.

According to another embodiment, a light emitting diode printed circuit board reflector is mounted on the light emitting diode printed circuit board with an opening for the light emitting diodes and light emitting diode printed circuit board connector cover portion for covering the light emitting diode printed circuit board connector. Thus, the light emitting diode printed circuit board connector is apart from the edge located light emitting diode with a distance shorter than the gap between light emitting diodes of the light emitting diode printed circuit board, whereas the light emitting diode printed circuit board connector cover overlaps with an active area of a liquid crystal panel.

According to still another embodiment of the present invention, a light emitting diode printed circuit board is encompassed by a bottom container which has a bottom plate and a lateral part. Thus, the bottom plate supports the light emitting diode printed circuit board with an inner surface; the lateral part supports an optical member and light emitting diode driving board with a flat plate and a lateral space, respectively.

Specifically, the lateral part has a slope connected to the bottom plate, a flat plate supporting the optical member and a vertical plate defining a lateral space with the slope and the upper surface. In the lateral space, a light emitting diode driving board is mounted to face the upper plate with the side on which electric parts are mounted.

According to yet another embodiment, the light emitting diode backlight assembly has a plurality of light emitting diode printed circuit boards which are aligned vertically. That is, the longer side of the light emitting diode printed circuit board is orthogonal to the longer edge of a bottom container of the light emitting diode backlight assembly. Accordingly, light emitting diode printed circuit board connector of each light emitting diode printed circuit board is located in the vicinity of the longer edge and connected to a light emitting diode driving board located within or near the longer edge of the bottom container. Then, an electrical cable connects the light emitting diode driving board and each light emitting diode printed circuit board connector without changing an extension direction vertically, thereby simplifying assembly.

BRIEF DESCRIPTION OF THE DRAWINGS

The above and/or other aspects, feature and advantages of the disclosure will become apparent and more readily appreciated from the following description of the exemplary embodiments, taken in conjunction with the accompanying drawings of which.

DETAILED DESCRIPTION OF THE INVENTION

Figure 1:
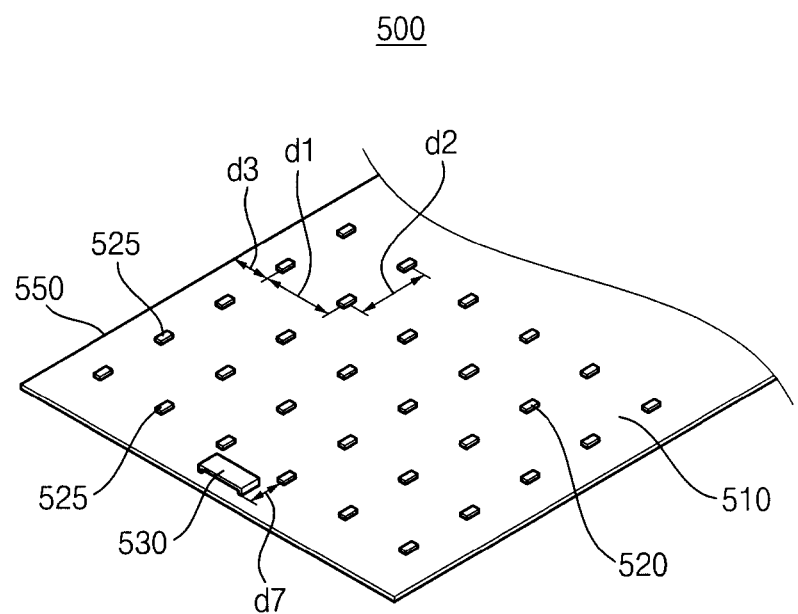
FIG. 1 is a perspective view showing an exemplary embodiment of an LED-PCB having a plurality of LEDs and an LED-PCB connector placed at an end portion of the LED-PCB.

Reference will now be made in further detail to exemplary embodiments, examples of which are illustrated in the accompanying drawings, wherein like reference numerals refer to like elements throughout. The embodiments are described below in order to explain the embodiments by referring to the figures.

The terms "the", "a" and "an" do not denote a limitation of quantity, but rather denote the presence of at least one of the referenced item. The suffix "(s)" as used herein is intended to include both the singular and the plural of the term that it modifies, thereby including at least one of that term (e.g., the "LED"(s) includes at least one "LED").

FIG. 1 is a perspective view of an LED-PCB comprising a plurality of LEDs and an LED-PCB connector placed at an end portion of the LED-PCB. Referring to FIG. 1, an LED-PCB 500 is provided with a printed circuit board ("PCB") 510, a plurality of LEDs 520 and an LED-PCB connector 530. Here, the PCB provides electrical connection between each of the LEDs 520 and the LED-PCB connector 530 with an embedded electrical pattern (not shown).

To provide improved optical performance, since LED-PCB 500 provides luminance with a limited number of LEDs 520, each LED is spaced apart from contiguous LEDs with a first gap d1 in a first direction and a second gap d2 in a second direction, as is shown in FIG. 1. The first gap d1 can be greater than, equal to, or less than the second gap d2. In an embodiment, the first gap d1 and the second gap d2 are the same, because each LED 520 has the same radiating characteristics in all directions.

Alternatively, unlike FIG. 1, the LEDs 520 may be placed in a triangular, pentagonal, or honeycomb arrangement, so long as high luminance and uniformity can be achieved with a limited number of LEDs 520. In this embodiment, the gap between LEDs may be regarded as the distance between the LEDs that are closest to each other.

At an edge portion of the LED-PCB 500, however, a third gap d3 between an edge located LED 525 and the edge 550 of the LED-PCB 500 is less than the first gap d1 and less than the second gap d2, which are in the middle of the LED-PCB 500, since the edge 550 meets a reflector (not shown) for redirecting light back towards the LED-PCB.

In addition, the LED-PCB connector 530, disposed at an end portion of the LED-PCB 510, is electrically connected to each LED 520, and transmits an LED driving signal by receiving an original LED driving signal from an external circuit (not shown). Alternatively, the LED-PCB connector 530 can be an Integrated Circuit ("IC", not shown), wherein the IC can transmit an LED driving signal.

As shown in FIG. 1, the LED-PCB connector 530 can be located in the vicinity of an edge located LED 525, or apart from an edge located LED 525, or contiguous to an LED, and distance d7 can be less than, equal to or greater than the gap d3, which is a distance from the edge located LED 525 to an edge where an LED-PCB connector is not disposed. In an embodiment, gap d7 is less than gap d3. Alternatively, the LED-PCB connector 530 can be located between two contiguous edge located LEDs 525, thereby enabling the LED-PCB 500 to be more compact.

Figure 2:
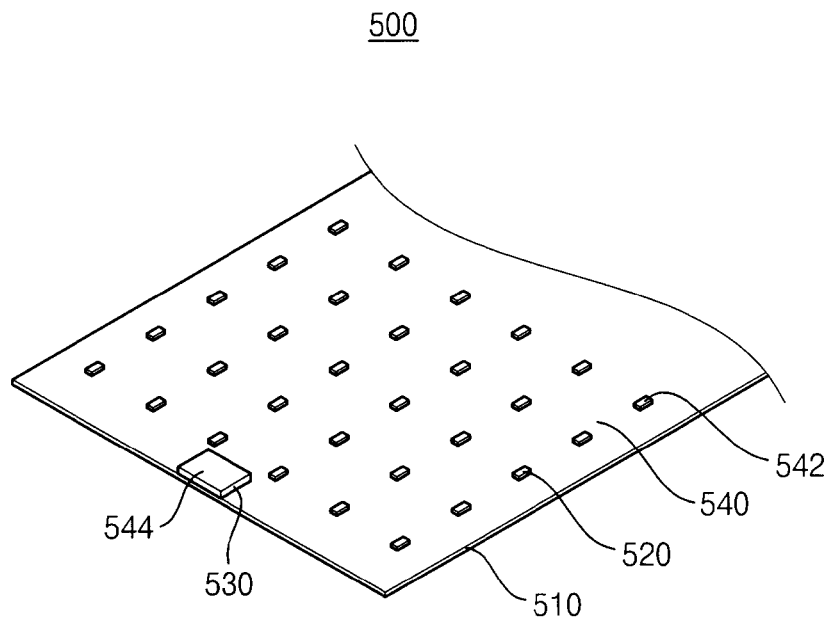
FIG. 2 is a perspective view showing an exemplary embodiment of an LED-PCB having an LED-PCB reflector with an opening corresponding to each LED and a connector cover portion covering the LED-PCB connector of FIG. 1.

A configuration of the LED-PCB is shown in FIG. 2, which depicts an LED-PCB with an additional reflectors, when compared to the LED-PCB shown in FIG. 1.

FIG. 2 is a perspective view of an LED-PCB comprising an LED-PCB reflector with an opening corresponding to each LEDs, and a connector cover portion covering the LED-PCB connector of FIG. 1. Referring to FIG. 2, the LED-PCB 500 has an additional LED-PCB reflector 540 on the PCB 510 to reflect and/or redirect light radiated from the LEDs 520. So that the light radiating from the LEDs 520 is not blocked, the LED-PCB reflector 540 does not cover the LED 520 and has an opening 542 at the location of each LEDs 520.

In contrast, the LED-PCB reflector 540 covers the LED-PCB connector 530 with an LED-PCB connector cover 544 since LED-PCB connector 530 is neither light-emitting nor light reflective, as is the LED-PCB reflector 540. Thus, without the LED-PCB connector cover 544, the LED-PCB connector 530 can be observed from outside of the backlight assembly, and such observation can detract from the uniformity of light from the backlight assembly. Thus, to fully cover the LED-PCB connector, the LED-PCB connector cover may extend beyond an edge of the LED-PCB.

In another aspect, according to one embodiment of the invention, the LED-PCB connector cover 544, the LEDs 520, and the LED-PCB connector 530 are located within the same region of the backlight assembly (not shown). Thus, in this embodiment, the LEDs 520 and the LED-PCB connector 530 are not separated from each other; instead, LED 520 and the LED-PCB connector 530 are disposed to be substantially adjacent to each other and within a space where light is emitted from the backlight assembly. Consequently, the LED backlight assembly is observed to provide uniform luminance and is compact.

In further detail, the LEDs 520 is vertically under and horizontally within a luminance active area of the backlight assembly (not shown), and the LED-PCB connector 530 is also vertically under and horizontally within the luminance active area of the backlight assembly (not shown). It has been observed that this configuration enables a compact backlight assembly In the same manner, since the luminance active area of the backlight assembly is substantially the same or slight larger than the display area of an LC panel (not shown), the LED-PCB connector 530 is also vertically under and horizontally within the display area of the LC panel to make an LCD assembly compact.

Figure 3A:
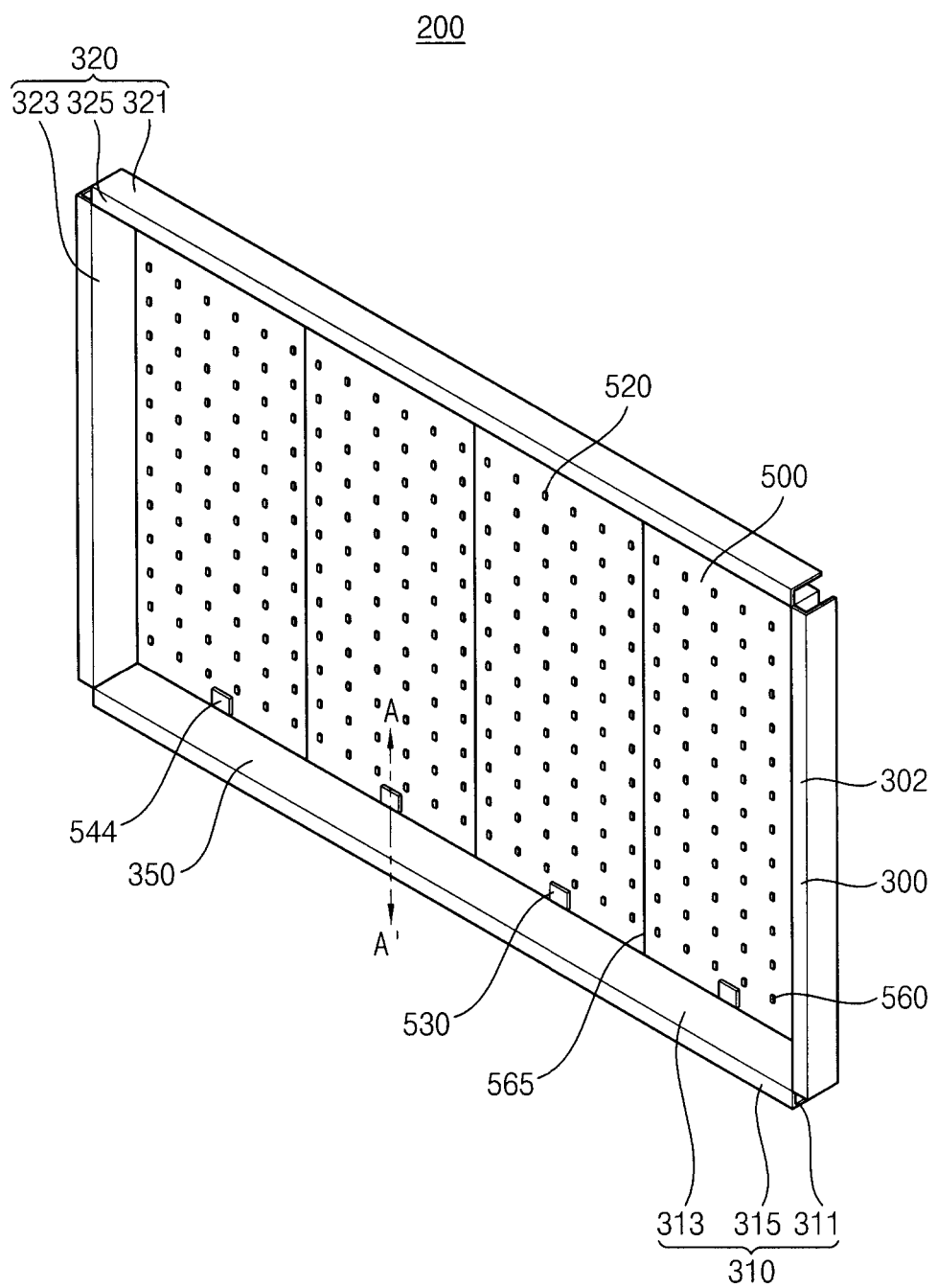
FIG. 3A is a perspective view showing an exemplary embodiment of a backlight assembly having a plurality of LED-PCBs arranged in parallel, wherein the LED-PCB connectors are under an active area of the backlight assembly.
Figure 3B:
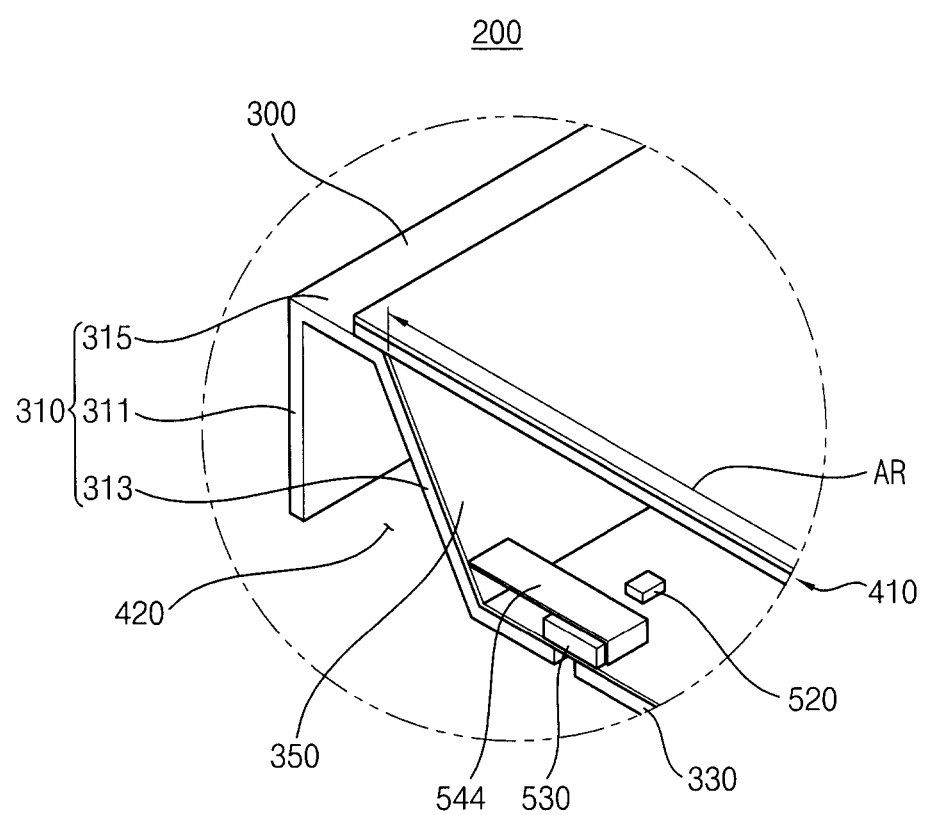
FIG. 3B is a combined cross-sectional view showing an exemplary embodiment of the backlight assembly taken along line A-A' of FIG. 3A and an optical member disposed thereon, the combined cross-sectional view showing an exemplary embodiment of an LED-PCB connector and an LED-PCB connector cover within an active area of the backlight assembly.

In further detail, FIGS. 3A and 3B show the relationship between the LED-PCB connector and the luminance active area of a backlight assembly.

FIG. 3A is a perspective view of a backlight assembly comprising a plurality of LED-PCBs arranged in a parallel configuration wherein an LED-PCB connector is under an active area of the backlight assembly. Referring to FIG. 3A, a plurality of LED-PCBs 500, as is also shown in FIGS. 1 and 2, are disposed on a bottom plate (not shown) of a bottom container 300. Specifically, the LED-PCBs 500 are disposed in parallel with a shorter edge 302 of the bottom container 300 to make LED-PCB driving easier. In further detail, if the LED-PCBs 500 are aligned horizontally along a longer edge 303 of the bottom container 300, then a path of the LED driving pattern (not shown) embedded in the LED-PCB 500 is longer. A longer path may cause an RC delay resulting in signal distortion not observed in an embodiment with the shorter electrical path (not shown), such as the embodiment comprising a vertically aligned LED-PCBs 500.

In addition, each LED-PCB connector 530 is disposed at the bottom side of the bottom container 300 to face a slope 313 of the bottom container 300. Also, each LED-PCB connector 530 is covered by an LED-PCB connector cover 544, which extends to the slope 313 of the bottom container 300. Here, the slope 313 of the bottom container 300 is a part of a lateral part 310 of the bottom container 300 and inclined outwardly from the bottom plate (not shown). The other parts of the lateral part 310 are a flat plate 315 and a vertical plate 311.

In an embodiment, the flat plate 315 may have an additional structure for receiving a backlight assembly part, including an optical member (not shown); the flat plate 315 can also provide a structure for connecting the slope 313 and the vertical part 311 to define a lateral space (not shown). In addition, the vertical part 311 can extend from the flat plate 315 to form an outermost part of the bottom container 300 and define a lateral space (not shown) together with the flat plate 315 and the slope 313.

In addition, regarding the edge 320 of the bottom container 300, the basic shape can be substantially similar to the lateral part 310 and have an inner surface 323 facing the LEDs 520, a flat plate 325 connected to the inner surface 323, and an outer surface 321 defining an outer dimension of the bottom container 300. Here, both of the slope 313 and the inner surface 323 are covered by a side reflector 350 for redirecting light to the inner space of the bottom container 300.

The inner space of the bottom container 300 can be full of light emitted by the LEDs 520 and reflected by the LED-PCB reflector 540 and the side reflector 350. Therefore, as shown in FIG. 3A, an upper edge of the side reflector 350 defines an active area of the backlight assembly Alternatively, wherein both the LEDs 520 and the LED-PCB connector 530 are located more towards the middle of the PCB than the side reflector 350, the LED-PCB connector 530 can be within the active area of the backlight assembly 200.

FIG. 3B is a combined cross-sectional view taken along line A-A' of FIG. 3A showing an optical member, the combined cross-sectional view showing an LED-PCB connector and an LED-PCB connector cover within an active area of the backlight assembly. Referring to FIG. 3B, on the flat plate 315 of the bottom container 300, optical member 410 is added to the backlight assembly of FIG. 3A. Specifically, the optical member 410 can be a light path controlling member, including at least one of diffusing plate, diffusing sheet, light collimating sheet or the like, or a combination comprising at least one of the foregoing light path controlling members.

As is shown in FIG. 3B, the backlight assembly 200 has a luminance active area AR in which the light is radiated and mixed together. Thus, with the optical member 410, which can be disposed at the light exiting space of the inner space of the bottom container 300, the distribution of the light is altered according to a type and arrangement of the optical member 410, so that light is evenly emitted from the outermost optical member. Specifically, the light is spread within the active area AR of the optical member 410, under which the slope 313 and the LED-PCB connector 530 are located.

In another aspect, there is uniform distribution of the light on the outermost optical member 410, and the LED-PCB connecter cover 544, covering the LED-PCB connector 530, is extended to the slope 313 so as not to make the LED-PCB connector visible from the outer space of the optical member 410. Alternatively the LED-PCB connector cover 544 can be substituted with other cover types as long as the existence of the LED-PCB connector 530 is not visible from outside of the backlight assembly. Other cover types, for example, may include a reflective cap only covering the LED-PCB connector or a white PET cover directly attached to the LED-PCB connector, or the like, or a combination comprising at least one of the foregoing cover types.

In addition, since the slope 313 with a side reflector 350 functions as an imaginary light source by reflecting light from the LEDs 520, the slope 313 is also horizontally within and vertically under the luminance active area AR of the backlight assembly 200, thus enabling the backlight assembly 200 to be compact. Because the slope 313 extends outwardly from the bottom to the top of the slope 313, between the slope 313 and the vertical plate 311, there is a lateral space 420, which can accommodate other parts of the backlight assembly 200.

Figure 4A:
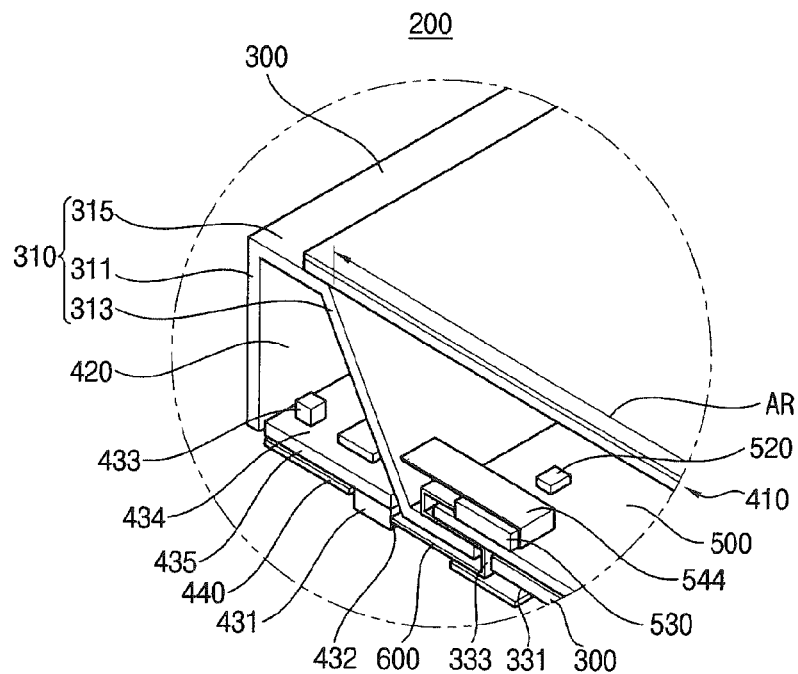
FIG. 4A is a cross-sectional view showing an exemplary embodiment of a backlight assembly having an additional part of an LED driving board added to the cross-sectional view of FIG. 3B.

FIG. 4A is a cross-sectional view of a backlight assembly comprising an additional part of an LED driving board added to the cross-sectional view of FIG. 3B. Referring to FIG. 4A, a lateral space 420 is defined between the slope 313 and the vertical plate 311 of the bottom container 300. In the lateral space 420, an LED driving board 430 is disposed with an LED driving board connector 431 on an outer surface 435 and an electronic part 433 on an inner surface 434.

The LED driving board 430 provides an electric signal to each LED board 500. The LED driving board 430 comprises an electronic part 433, wherein electronic part 433 can include an integrated circuit (IC), resistor, capacitor, or the like, or a combination comprising at least one of the foregoing electronic parts. By being disposed at a location that is different from that of the LED driving board connector 431, the electronic part 433 is not exposed to the outer atmosphere and can be protected from mechanical impact. Also, the electronic part 433 can be disposed to face inwardly, enabling the thickness of the backlight assembly 200 and the size of the LCD assembly to be reduced even if the electronic part is taller than the LED driving board connector 431.

This embodiment is not limited to the configuration of an oppositely positioned LED driving board connector 431 and electronic part 433. Thus both the LED driving board connector 431 and the electronic part 433 can be placed at the same surface of the LED driving board 430.

In any of the foregoing configurations, the outer surface 435 of the LED driving board may be located above the outer surface 331 of the bottom plate 330. Thus, the outer surface 435 of the LED driving board 430 can be disposed under the flat plate 315, rather than on the outer surface 331 of the bottom plate 330, to make the backlight assembly 200 and the LCD more compact.

Thus the LED driving board connector 431 can protrude from the outer surface 435 of the LED driving board 430 to protrude from the outer surface 331 of the bottom plate 330 for connection with the LED-PCB connector 530. Nonetheless, the size of the backlight assembly 200 and the LCD can be compact because the LED driving board 430 is located within the bottom plate 330, specifically on the outer surface 331 of the bottom plate 330, of the bottom container 300.

As is shown in FIG. 4A, for shielding electromagnetic radiation of the LED driving board 430, a shield 440 is disposed at the lateral space 420 of the bottom container 300 and combined with the LED driving board 430. For combination with the LED driving board 430, the shield 440 may be adhered to the LED driving board 430 by a conductive adhesive or fixed to the LED driving board 430 by a fastener. Exemplary fasteners include a screw, rivet, or the like.

The shield 440 may cover substantially the whole surface of the outer surface of the LED driving board 430, and can be integrated with the LED driving board 430.

The shield can cover and hide the outer surface 435 of the LED driving board 430. Thus the outer surface 435 of the LED driving board 430 is disposed on the flat plate 315 rather than on the outer surface 331 of the bottom plate 330. The shield 440 may be disposed either in the same plane as the outer surface 331 of the bottom plate 330, or on the flat plate 315, rather than on the outer surface 331 of the bottom plate 330, to reduce the thickness of the backlight assembly 200 and the LCD.

To provide an electric signal and power to the LED-PCB 500, a signal transmitting cable 600 is engaged with the backlight assembly 200. In detail, one end of the signal transmitting cable 600 is inserted into the LED-PCB connector 530 inlet (not shown), while the other end is inserted into the LED driving board connector outlet 432. Specifically, the LED-PCB connector inlet and the LED driving board connector outlet 432 can face each other with an interposed bottom plane 330. Thus, to reduce the length of the signal transmitting cable 600, both of the connectors 530, and 431 maybe disposed in proximity to each other.

A manufacturing method of the backlight assembly can be understood in view of FIG. 4. A bottom container 300 is provided. The bottom container 300 has a bottom plate 330 and a lateral part 310 comprising a lateral space 420, the lateral space defined by a slope 313, a flat plate 315, and a vertical plate 311.

Next an LED-PCB 500, or a plurality of LED-PCBs 500, are disposed on the bottom plate 330 of the bottom container 300. Each of the LED-PCB 500 has an LED-PCB connector 530, which is arranged side by side with the LED-PCB connector of a contiguous LED-PCB. Alternatively, an LED driving board 430 is combined with a shield 440 that can be fixed to the bottom container 300 and secured into the lateral space 420 of the lateral part 310.

Thus, since the shield 440 shields the electromagnetic radiation from the LED driving board 430, the shield 440 is directly fixed to the electrically conductive metal bottom container 300 while the LED driving board 430 is connected to the bottom container 300 indirectly.

Next, the LED-PCB 500 and the LED driving board 430 are fixed to the bottom container 300, the signal transmitting cable 600 connected the LED driving board connector 431 and the LED-PCB connector 530 to transmit the LED driving signal. If desired, the optical member 410 is disposed on the flat plate 315 of the bottom container 300.

During assembly of the backlight assembly 200, as is shown in FIG. 4A, the signal transmitting cable 600 can be bent twice to pass through a through-hole 333, which is disposed below the LED-PCB connector 530. Specifically, the signal transmitting cable 600 is folded at the edge of the LED-PCB 500, and folded again at the through-hole 333, below the LED-PCB connector 530. Thus the signal transmitting cable 600 can be disposed in a single direction without bending at an angle so as to shorten the length of the cable 600.

Figure 4B:
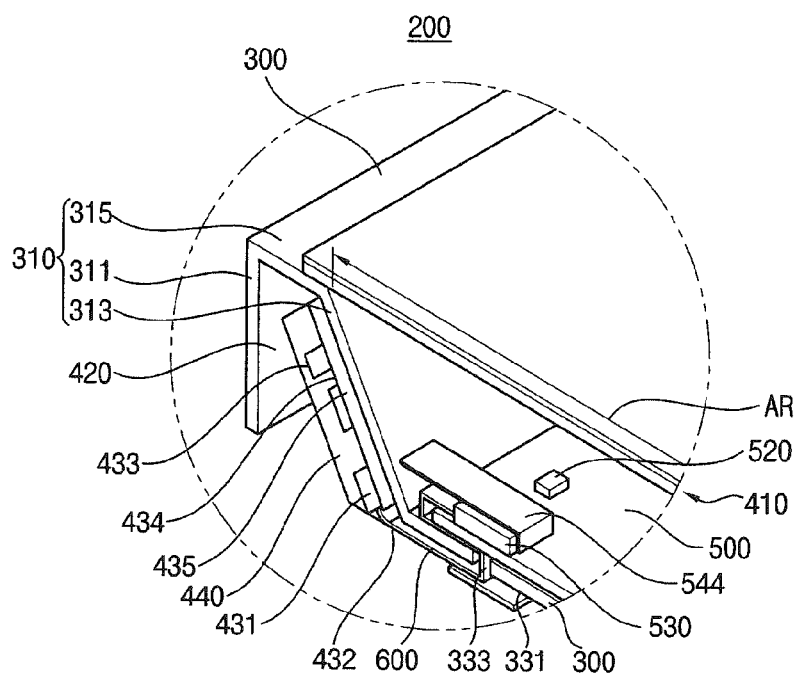
FIG. 4B is a cross-sectional view showing an exemplary embodiment of a backlight assembly having an additional part of an LED driving board added to the cross-sectional view of FIG. 3B.

FIG. 4B is a cross-sectional view showing an embodiment of a backlight assembly comprising an additional part of an LED driving board added to the cross-sectional view of FIG. 3B.

Referring to FIG. 4B, a lateral space 420 is defined by a slope 313 and a vertical plate 3 11 of a bottom container 300. In the lateral space 420, an LED driving board 430, is disposed on the slope. Electronic parts 433 and an LED driving board connector 431 are disposed on the LED driving board 430.

The LED driving board 430 provides an electric signal to each of the LED board 500 and comprises an electronic part 433, wherein electronic part 433 can include an integrated circuit (IC), resistor, capacitor, or the like, or a combination comprising at least one of the foregoing electronic parts. By being disposed on the same plane as the LED driving board connector 431 and in the lateral space 420, the electronic part 433 is not exposed to the outer atmosphere and can be protected from mechanical impact. Also, as is shown in FIG. 4B, a shield 440 covers the LED driving board 430 to block electromagnetic radiation generated by the LED driving board 430.

The shield 440 can substantially cover the LED driving board 430, and the LED driving board 430 and the shield 440 may be integrated to comprise a single electronic element. Although the shield 440 can cover the LED driving board 430, the shield 440 can be disposed in the lateral space 420.

Alternatively, the shield 440 may be a distinct component, thus not integrally disposed with the LED driving board 430 to cover the LED driving board 430. That is, a first end of the shield 440 can be connected to an inner surface of the lateral part 310 to define the lateral space 420 and a second end of the shield 440 can be connected to the bottom plate 330, so that the electronic part 433 is spaced apart from the LED driving board connector 431.

For providing an electric signal and power to the LED-PCB 500, a signal transmitting cable 600 can be engaged into the backlight assembly 200. In detail, one end of the signal transmitting cable 600 can be inserted into the LED-PCB connector 530 inlet (not shown), while the other end is inserted into the LED driving board connector outlet 432. Specifically, the LED-PCB connector inlet and LED driving board connector outlet 432 can face each other and be interposed by bottom plane 330. Thus, to make the signal transmitting cable 600 short, both of the connectors 530, and 431 may be disposed close to each other.

Figure 5A:
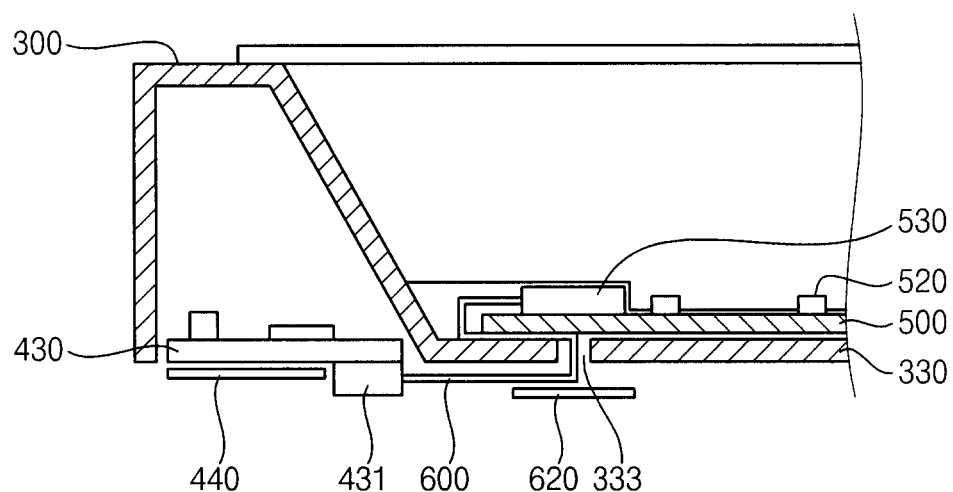
FIGS. 5A to 5C are cross-sectional views showing exemplary embodiments of a backlight assembly employing a signal transmitting cable and showing the location of an LED-PCB connector and a through-hole in the bottom plate of the bottom container.
Figure 5B:
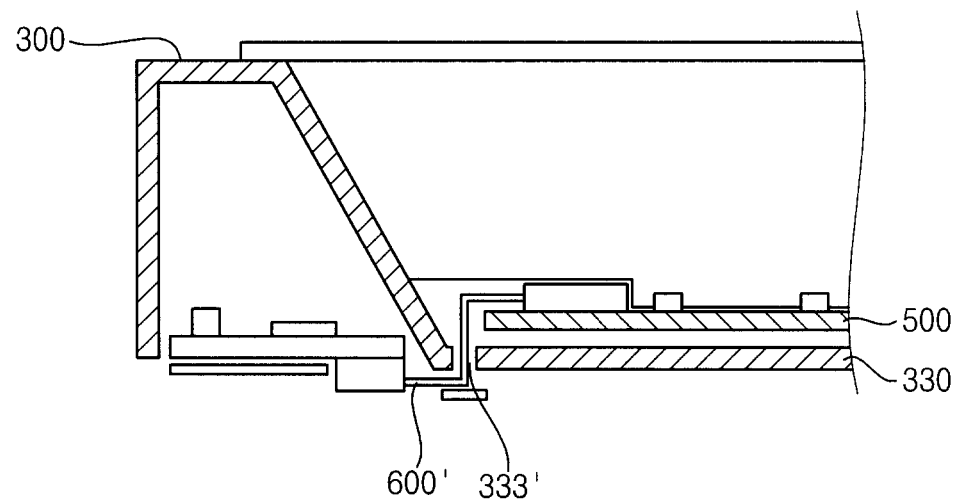
Figure 5C:
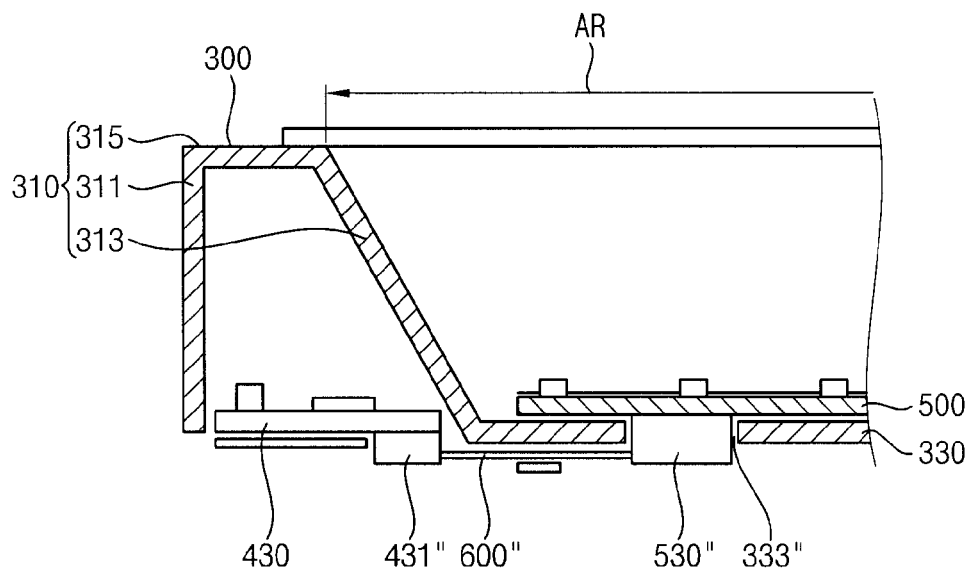

Alternatively, the signal transmitting cable may be arranged in various ways as is shown in FIG. 5A through 5C.

FIGS. 5A through 5C illustrate various cross-sectional configurations of a signal transmitting cable arrangement within a backlight assembly. FIG. 5A is simplified cross-sectional view of FIG. 4 showing an embodiment of the double folding structure of the signal transmitting cable 600. Specifically, the LED-PCB connector 530 is upwardly disposed on an upper part of the LED-PCB 500 along with LEDs 520, while the LED driving board connector 431 is disposed on a lower part of the outer side of the LED driving board 430.

The bottom plane 330 has a through-hole 333 disposed under the LED-PCB 500. More specifically, the through hole 333 overlaps with the LED-PCB connector 530. Consequently, the signal transmitting cable 600 of FIG. 5A is folded twice at a point beyond the edge of the LED-PCB 500 and at the through-hole 333 of the bottom plane 330. In addition, the through-hole 333 may be blocked by an adhesive tape 620 to prohibit passage of a particle.

FIG. 5B shows a simplified cross-sectional view of another exemplary embodiment of a backlight assembly employing a signal transmitting cable. Unlike FIG. 5A, the bottom plane 330 of the bottom container 300 has a through-hole 333' beyond an edge of the LED-PCB 500 to allow the signal transmitting cable 600' to pass through. Therefore, the signal transmitting cable 600' is not folded over at any point and has less length than in the embodiment illustrated in FIG. 5A.

FIG. 5C shows another exemplary embodiment of a backlight assembly configuration comprising an LED-PCB connector on an opposite surface of the LED mounting surface of the LED-PCB. As is shown in FIG. 5C, the LED-PCB connector 530" is disposed on a lower portion like the LED driving board connector 431". Specifically, an inlet (not shown) of the LED-PCB connector 530" is exposed from the inner space of the bottom container 300 and directly faces the LED driving board connector 431". Where both connectors 431" and 530" face each other, a signal transmitting cable 600" may be disposed without any bending or folding, unlike the configurations shown in FIGS. 5A and 5B; therefore, the total length of the signal transmitting cable 600" can be reduced.

In addition, even though the LED-PCB connector 530" is outwardly disposed on the LED-PCB 500, the slope 313 and the vertical plate 311 at lateral side 310 can define a lateral space 420 to accommodate the LED driving board 430. Also, the LED-PCB connector 530" can be disposed overlapping the active area AR of the backlight assembly (not shown) to make the backlight assembly and the LCD more compact.

Figure 6:
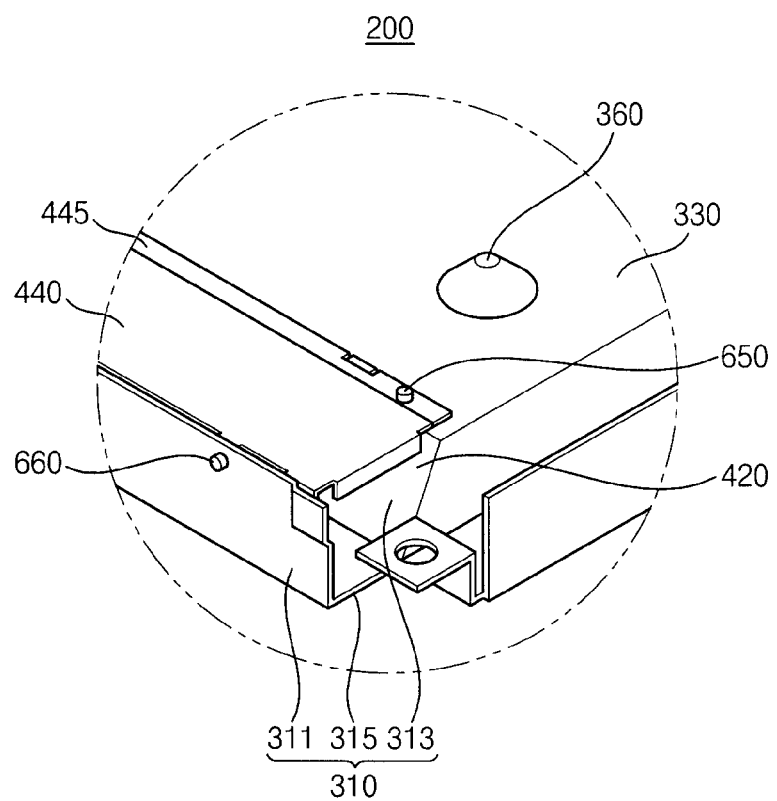
FIG. 6 is a perspective view showing an exemplary embodiment of a corner of a backlight assembly having a lateral part on which an LED driving board is disposed.

FIG. 6 is a perspective view showing an exemplary embodiment of a corner of a backlight assembly comprising a lateral part on which an LED driving board is disposed. Specifically, FIG. 6 is a corner of a flipped backlight assembly of FIG. 3A. Referring to FIG. 6, the backlight assembly 200 has a bottom container 300 and an LED driving board (not shown) integrated with a shield 440. The bottom container has a slope 313, a flat plate 315, and a vertical plane 311 which define a lateral space 420 in which an LED driving board (not shown) is positioned.

Here, the LED driving board (not shown) is indirectly connected to both the bottom plane 330 and the vertical plane 311 by a shield 440. In detail, the LED driving board is fixed to the shield 440 to provide an integrated structure.

During assembly, the shield 440 can be disposed on the bottom plane 330 of the bottom container 300 with a first fixing structure 650 while the shield 440 is disposed on the vertical plane 311 of the bottom container 300 with a second fixing structure 660. Thus, as is shown in FIG. 6, the first fixing structure 650 and the second fixing structure 660 can face different directions. In addition, both the first and second fixing structures 650 and 660 comprise fixing holes on the shield 440 and the bottom container 300, respectively, along with a fastener, such as a screw. Alternatively, the fixing structure may comprise a hole in the shield and a protrusion on the bottom container, or the like, or a combination comprising any of the foregoing configurations.

After the shield 440 is fixed to the bottom container 300, since both the LED driving board and the electric part (not shown) disposed thereon at the reverse side from the shield are positioned in the lateral space 420, the connection part 445 of the shield 440 and the bottom plane 330 are substantially smooth and have a height which is less than a height of a supporting structure 360 of the bottom plane 330.

Specifically, the supporting structure 360 is designed for putting the LCD assembly or the backlight assembly on a stage during the assembly process and can prevent contact between the stage and any parts of the LCD or backlight assembly. Therefore, the supporting structure 360 defines the outermost part of both of the LCD and backlight assembly and allows the location of the shield 440 to remain within the thickness of the LCD and backlight assembly.

Figure 7A:
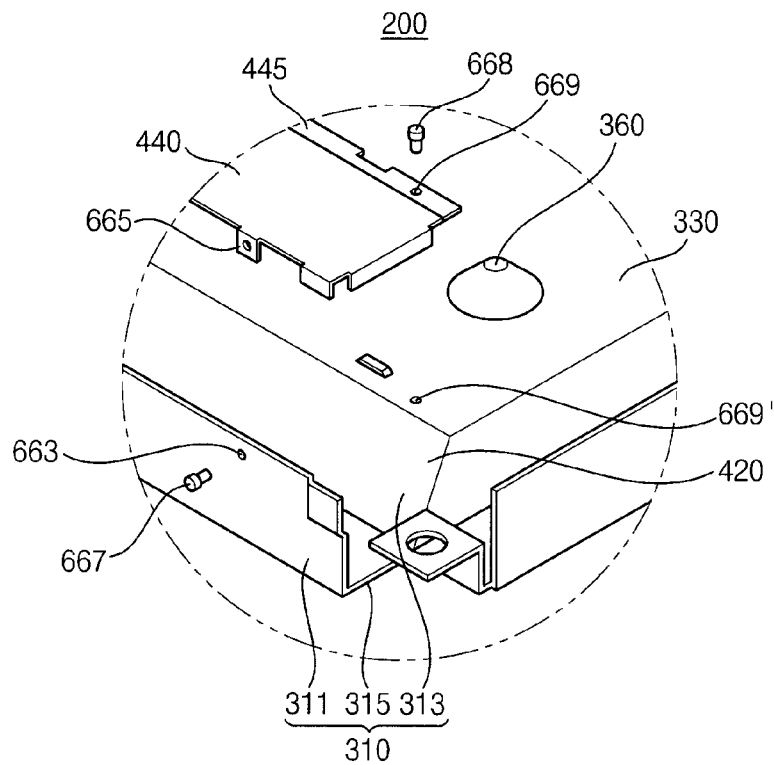
FIG. 7A is a perspective view showing an exemplary embodiment of a corner of a bottom container wherein a lateral part receives the LED driving board of FIG. 6 and a shield fixing structure is disposed directly on a vertical plane.

FIG. 7A is an exploded and perspective view showing an exemplary embodiment of a corner of a backlight assembly as is shown in FIG. 6, wherein a lateral part receives the LED driving board while a fixing structure is directly formed on the vertical plane. Referring to FIG. 7A, in a second fixing structure of FIG. 6, a penetration hole 663 is disposed on the edge of a vertical plane 311 to overlap installation bend 665 of the shield 440. Then, a first screw 667 is used for connecting both the penetration hole 663 and installation bend 665.

In addition, at the first fixing structure of FIG. 6, a second screw 668 is inserted to a connection part hole 669 and a bottom plane hole 669' from a different direction of each of the penetration hole 663, the installation bend 665, and the first screw 667.

Figure 7B:
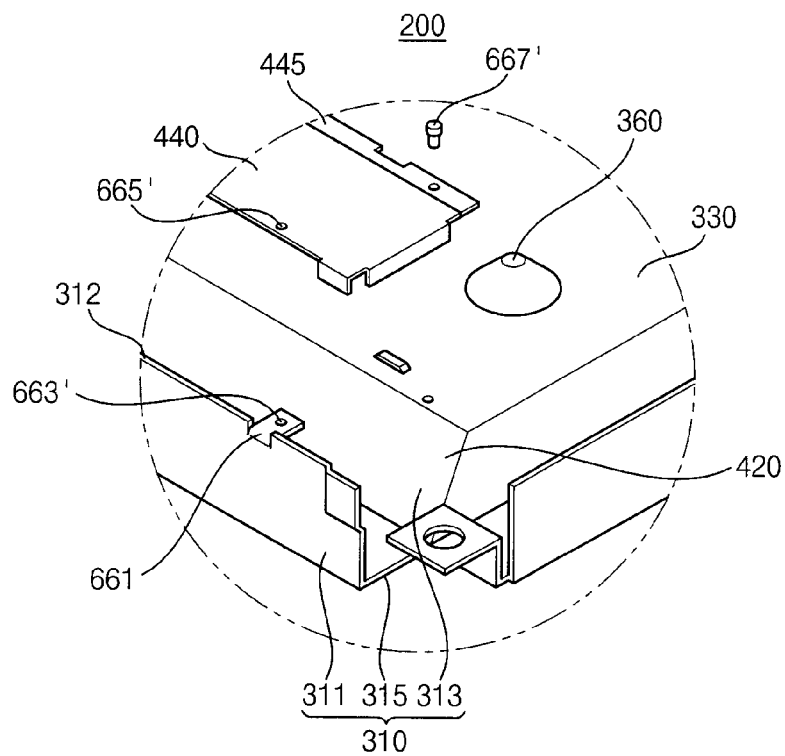
FIG. 7B is an alternative perspective view showing an exemplary embodiment of a corner of a bottom container wherein a vertical plane of the lateral part is partly extended inwardly to form a shield fixing structure.

FIG. 7B is an alternative exploded and perspective corner view of a corner of a bottom container whose vertical plane of the lateral part is partly extended inwardly to form a shield fixing structure. Referring to FIG. 7B, unlike FIG. 7A, a penetration hole 663' of the lateral plane 311 is disposed on a bend 661, which is partly extended inwardly from the lateral plane 311 to bottom plane 330. In turn, the shield 440 may be flat at a point corresponding to the penetration hole 663'. During assembly, a third screw 667' is inserted from beyond the bottom plane 330 of the bottom container 300 to an installation hole 665' of the shield. Also, a fourth screw 667" is inserted from and in the same direction as the third screw 667' into the penetration hole 663'. Therefore, it has been observed that assembly, especially automatic assembly of the backlight, can be readily performed.

In another aspect, the bend 661 of the vertical plane 311 may be positioned on the flat plate 315 away from the edge 312 of the vertical plane 311 so as not to place the head of the screw 667' beyond the thickness of the "LCD".

Figure 7C:
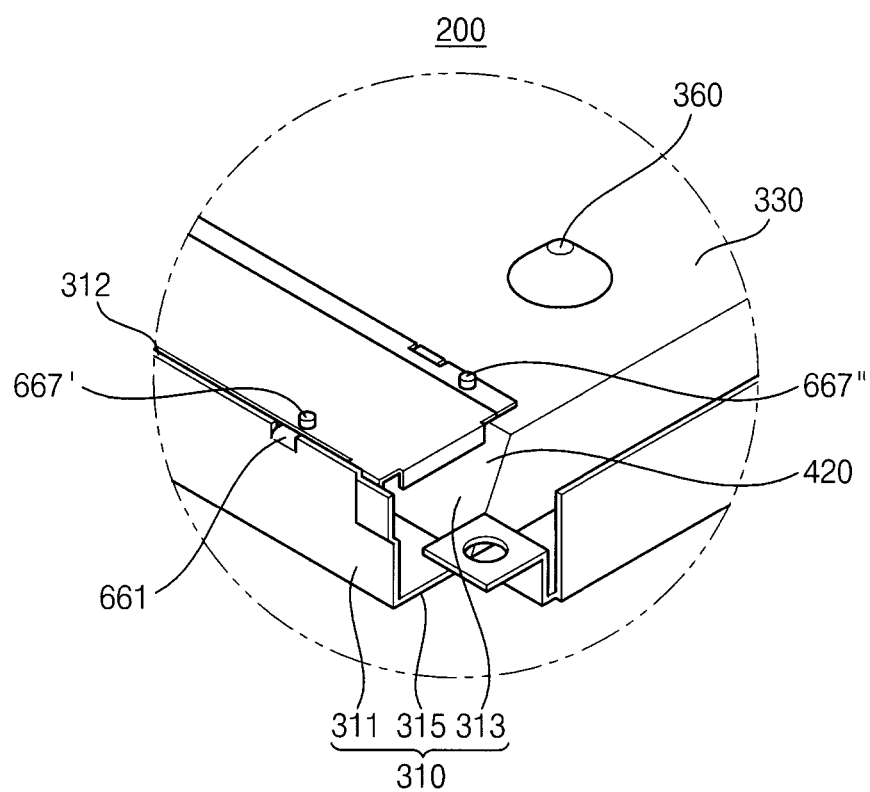
FIG. 7C is a perspective view showing an exemplary embodiment of a corner of a backlight assembly when the assembly illustrated in FIG. 7B is assembled.

FIG. 7C is a perspective view showing an exemplary embodiment of a corner of a backlight assembly when the assembly shown in FIG. 7B is finished. Referring to FIG. 7C, both the third and fourth screws 667', 667" are fixed at substantially the same height as the flat plate 315 of the bottom container 300, and from the same direction. In detail, since the bend 661 is lower in height than the edge 312 of the vertical plane 311, the head of the screw 667' on the bend 661 may not impact the total thickness of the backlight assembly or the LCD.

The backlight assembly can comprise a side part other than the lateral part.

Figure 8A:
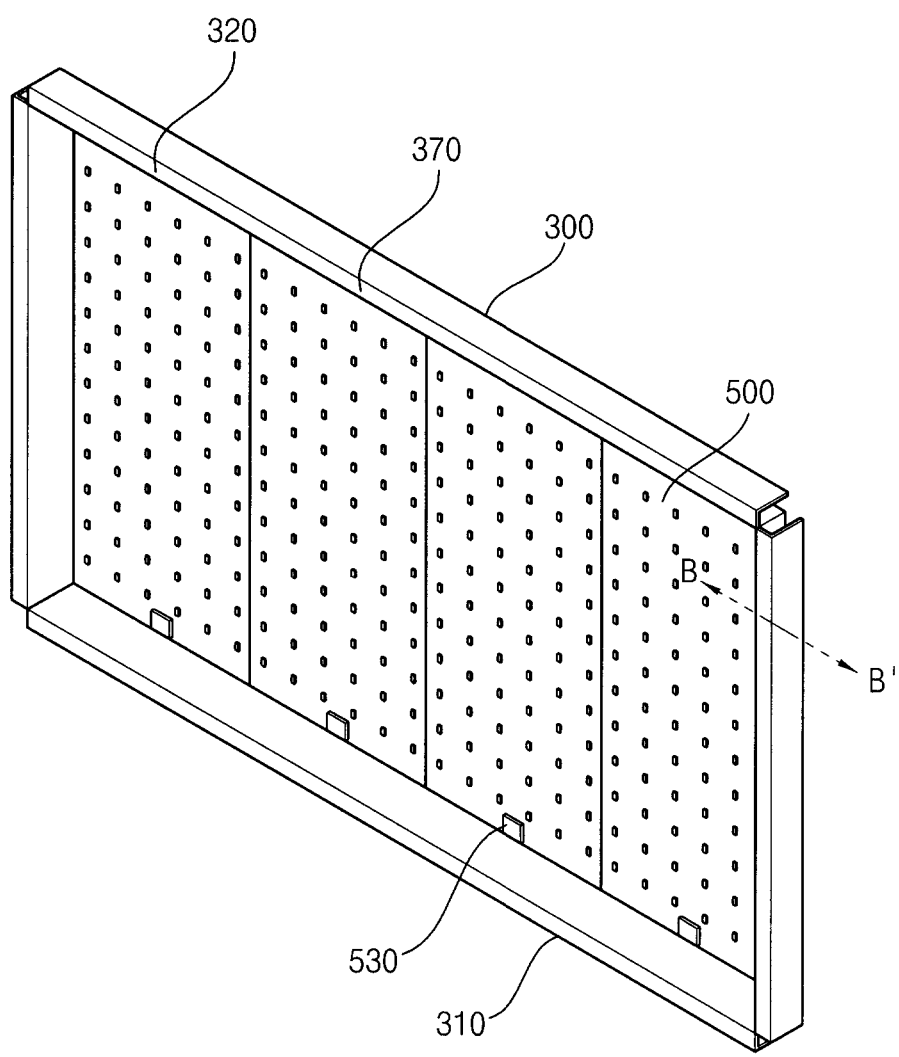
FIG. 8A is a perspective view showing an exemplary embodiment of a backlight assembly having a bottom container comprising a side part disposed on an edge of a bottom container other than the edge comprising the LED-PCB connector.

FIG. 8A is a perspective view showing an exemplary embodiment of a backlight assembly comprising a bottom container whose side parts are disposed on an edge of a bottom container other than the edge of the LED-PCB connector. Referring to FIG. 8A, a plurality of LED-PCBs 500 are surrounded by a plurality of edges 370 of the bottom container 300. In an embodiment, one edge is in the vicinity of LED-PCB connector 530 and encompasses an LED driving board (not shown). The edge is a lateral part 310 as is shown in FIGS. 3A through 7C. In addition, another edge, specifically side part 320, is neither in the vicinity of the LED-PCB connectors 350 nor encompass the LED driving board. The side part 320 is shown in FIG. 8B.

Figure 8B:
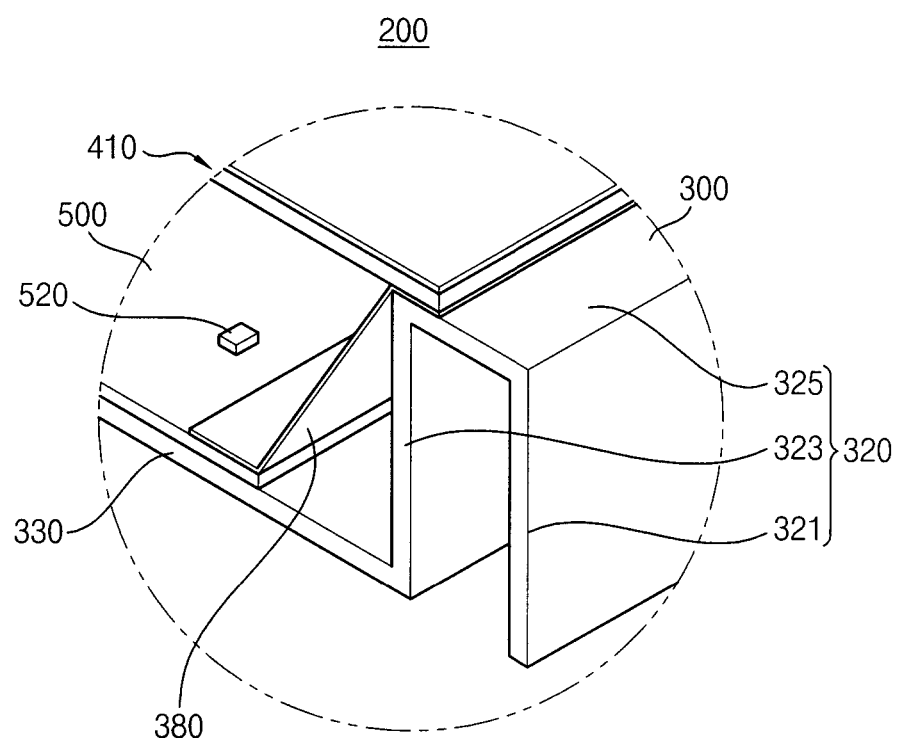
FIG. 8B is a combined cross-sectional view showing an exemplary embodiment of a backlight assembly taken along line B-B' of FIG. 8A and an optical member disposed thereon.

FIG. 8B is a combined cross-sectional view taken along line B-B' of FIG. 8A showing an exemplary embodiment of a backlight assembly and an optical member disposed thereon. Referring to FIG. 8B, a backlight assembly 200 comprises a bottom container 300, an LED-PCB 500, an LED-PCB reflector 540, a side reflector 380, and an optical member 410.

The bottom container 300 has a side part 320. In an embodiment, side part 320 does not comprise LED-PCB connectors or LED driving boards. In further detail, the side part 320 has a flat plate 325, inner wall 323, and a vertical plane 321. Once an LED driving board is not disposed within the cavity formed by side part 320, the flat plate 325 can be as narrow as desired. Thus, so long as the optical member 410 is supported by the flat plate 325, the flat plate 325 may have a width determined by the desired overlap distance with the optical member 410. Alternatively, if there is another part that may be disposed on the flat plate 325, such as a middle frame (not shown), then the flat plate 325 may be as narrow as desired to support both the optical member 410 and the other part.

In addition, the inner wall 323 of the side part 320 may extend vertically from the bottom plane 330 of the bottom container 300 since the vertical structure is good for narrowing the overall dimension of the side part 320. Thus, even though not depicted in FIG. 8B, a side reflector 380 can be disposed vertically by being directly attached to the inner wall 323 of the side part.

Alternatively, as is depicted in FIG. 8B, the side reflector 380 may be slanted to effectively reflect light from the LED 520. Alternatively, although not depicted in FIG. 8B, the inner wall 323 of the side part 320 can be slanted to support a side reflector 380, which aids the reflection of the light from the LEDs 520. Thus, the side reflector 380, near the side part 320, may be disposed closer to vertical than the side reflector near the lateral part of FIGS. 3B through 5C.

In addition, the side reflector can be integrated with and placed near all the edges of the bottom container.

Figure 9:
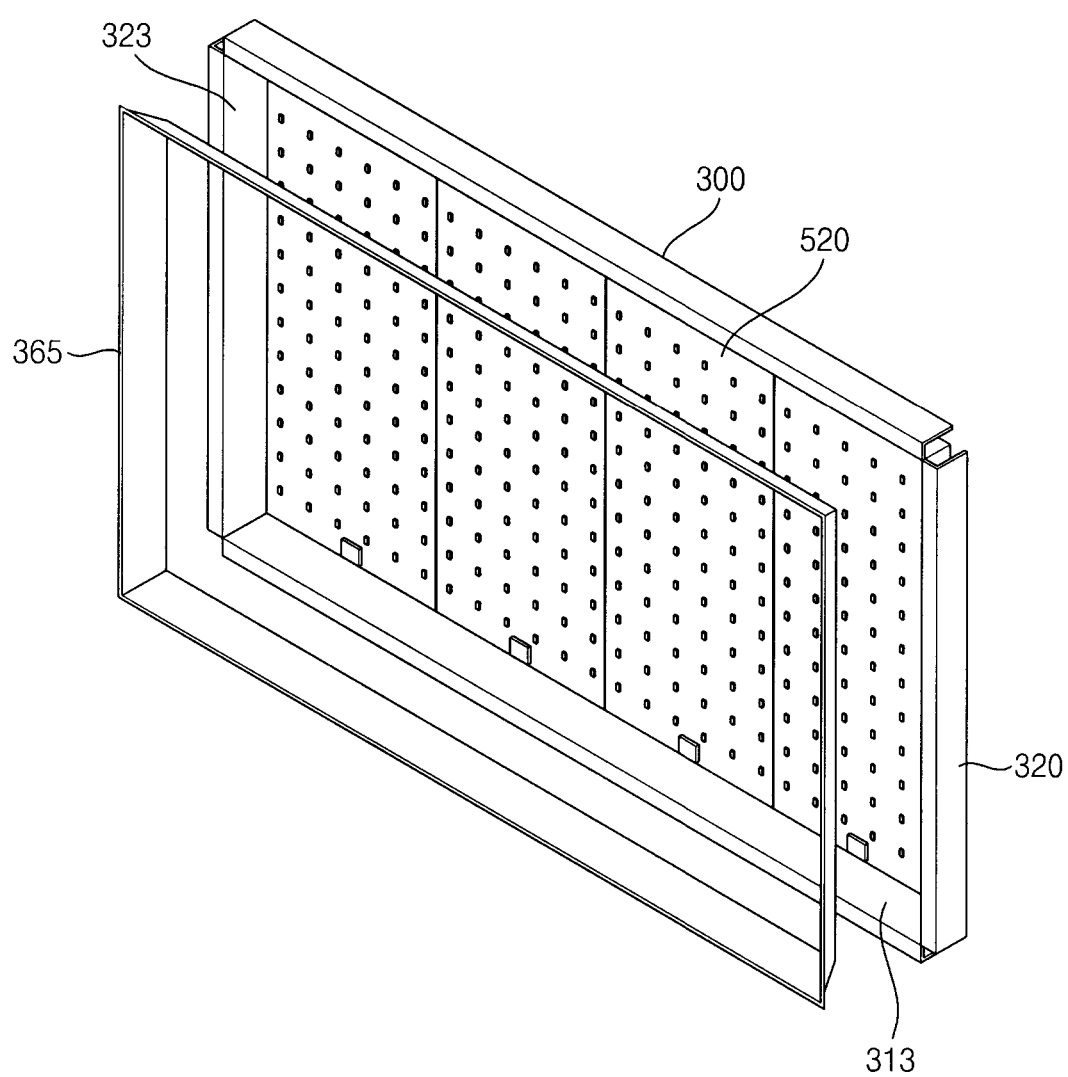
FIG. 9 is an exploded perspective view showing an exemplary embodiment of a backlight assembly comprising an integrated side reflector.

FIG. 9 is a perspective view showing an exemplary embodiment of a backlight assembly which includes an integrated side reflector. Referring to FIG. 9, a backlight assembly 200 has a bottom container 300 and an integrated side reflector 365. Here, the integrated side reflector 365 fits within the inner walls 323 and the slope 313 of the bottom container 300, effectively reflecting light from the LEDs 520. In addition, the integrated side reflector 365 can comprise either a film, a thin plastic, or the like so as to make the backlight assembly compact. In an embodiment, the unified side reflector 365 may not fit entirely within the inner walls 323.

Figure 10:
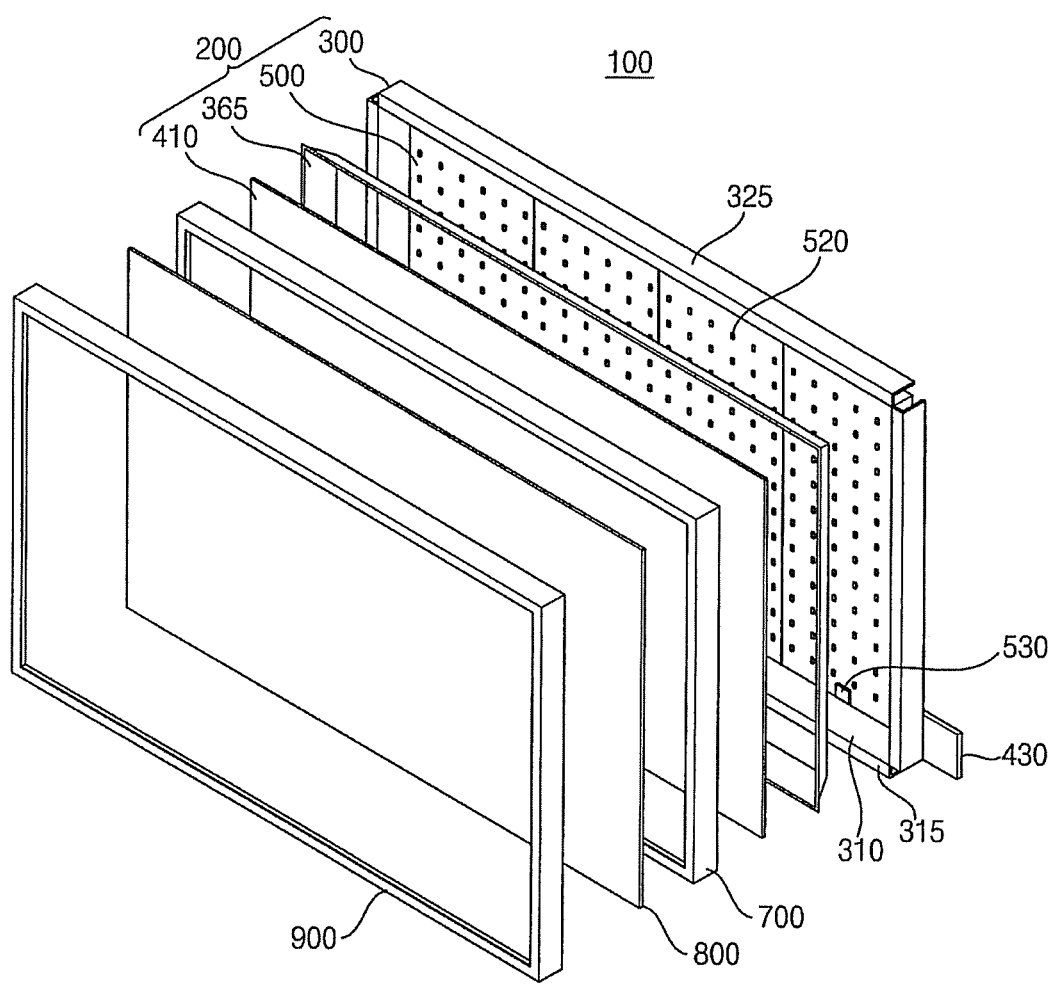
FIG. 10 is an exploded perspective view showing an exemplary embodiment of an LCD having a bottom container encompassing an LED driving board, an LC panel, and a top frame combined with the bottom container.

FIG. 10 is an exploded perspective view showing an exemplary embodiment of an LCD comprising a bottom container encompassing an LED driving board. Referring to FIG. 10, a backlight assembly 200 of bottom container 300, a plurality of LED-PCBs 500 and an optical member 410 are provided.

In addition to the backlight assembly 200, a middle frame 700 is disposed on a flat plate 315 of the bottom container 300 and covered by a top frame 900. Here, on or over the flat plate 315 of the bottom container 300, a liquid crystal (LC) panel 800 is disposed for displaying an image. Thus the middle frame 700 may also be disposed between the bottom container 300 and the LC panel 800.

With respect to the configuration depicted in FIG. 10, regardless of the existence of the middle frame 700, the LED-PCB connector 530 is located below the LC panel 800 and is in the same optical environment as the LEDs 520 by being disposed near the LEDs 520. In addition, even though the LED-PCB connector 530 faces outside, as is depicted in FIG. 5C, and is not within the same optical environment as the LEDs 520, still the LED-PCB connector 530 is below the image displaying area of the LC panel 800. In this case, the LED-PCB connector 530 is also overlapped with the active area of the backlight assembly 200.

At the bottom of the LCD of FIG. 10, an LED-PCB connector 530 is provided in the vicinity of the LED driving board 430 so as to accommodate interconnection with a shortened electric connector (not shown). With the disclosed simplified configuration, and simplified assembly of the LED-PCB connector 530 and the LED driving board 430, reduced assembling time and low manufacturing cost are observed.

In addition, since the LED driving board 430 is received within the lateral part 310 of the bottom container 300, an external dimension of both the backlight assembly and the LCD maybe reduced.

The above-described embodiments are merely meant to be illustrative and not limiting. It will thus be obvious to those skilled in the art that various changes and modifications may be made without departing from this disclosure in its broader aspects. Therefore, the appended claims encompass all such changes and modifications as fall within the true spirit and scope of this disclosure.

What is claimed is:

1. A backlight assembly, comprising:
   a bottom container comprising a bottom plate and a side edge surrounding the bottom plate;
   a light emitting diode printed circuit board disposed on the bottom plate, the light emitting diode printed circuit board comprising a plurality of light emitting diodes and a light emitting diode printed circuit board connector;
   a light emitting diode driving board comprising a light emitting diode driving board connector; and
   a signal transmitting cable comprising a first end and a second end, the signal transmitting cable electrically connecting the light emitting diode driving board connector and the light emitting diode printed circuit board connector,
   wherein at least one side edge is a lateral part comprising a lateral space and wherein the light emitting diode driving board is disposed in the lateral space,
   wherein the lateral part comprises a slope connected to the bottom plate, a flat plate outwardly connected to the slope and a vertical plate vertically connected to the flat plate, the vertical plate, the flat plate and the slope defining the lateral space.

2. The backlight assembly of claim 1, further comprising a side reflector disposed on the lateral part.

3. The backlight assembly of claim 1, wherein the light emitting diode printed circuit board further comprises a light emitting diode printed circuit board reflector, wherein the light emitting diode printed circuit board reflector has a light emitting diode printed circuit board connector cover covering the light emitting diode printed circuit board connector.

4. The backlight assembly of claim 1, wherein the side edge defines a luminance active area, wherein the light emitted from the plurality of light emitting diodes is radiated and mixed together, and wherein both the plurality of light emitting diodes and the light emitting diode printed circuit board connector are disposed within the luminance active area.

5. The backlight assembly of claim 4, wherein the light emitting diode printed circuit board further comprises a light emitting diode printed circuit board reflector, the light emitting diode printed circuit board reflector comprising a light emitting diode printed circuit board connector cover which covers the light emitting diode printed circuit board connector.

6. The backlight assembly of claim 1, wherein the light emitting diode driving board has an inner surface and an outer surface, wherein the inner surface of the light emitting diode driving board faces the flat plate of the lateral part.

7. The backlight assembly of claim 6, wherein the light emitting diode driving board connector is disposed on the outer surface of the light emitting diode driving board.

8. The backlight assembly of claim 7, wherein the light emitting diode driving board connector protrudes from the outer surface of the light emitting diode driving board to protrude from the outer surface of the bottom plate.

9. The backlight assembly of claim 1, wherein the light emitting diode driving board has an inner surface facing the flat plate of the lateral part and an outer surface opposite the inner surface, wherein an electronic part of the light emitting diode driving board is disposed on the inner surface and the light emitting diode driving board connector is disposed on the outer surface.

10. The backlight assembly of claim 1, wherein the bottom plate of the bottom container comprises a through-hole.

11. The backlight assembly of claim 10, wherein the through-hole is disposed under the light emitting diode printed circuit board.

12. The backlight assembly of claim 11, wherein the first end of the signal transmitting cable is electrically connected to the light emitting diode driving board connector, comprises a first folding portion at the through-hole of the bottom plate, comprises a second folding portion at an edge of the light emitting diode printed circuit board, and is connected to the light emitting diode printed circuit board connector with the second end.

13. The backlight assembly of claim 11, wherein the light emitting diode printed circuit board has an inner side and an outer side, wherein the plurality of light emitting diodes are disposed on the inner side, and wherein the light emitting diode printed circuit board connector is disposed on the outer side, the light emitting diode printed circuit board protruding from the outer side of the light emitting diode printed circuit board and passing through the through-hole of the bottom plate, the signal transmitting cable electrically connecting the light emitting diode board connector and the light emitting diode printed circuit board connector with the first end and the second end, respectively.

14. The backlight assembly of claim 10, wherein the through-hole is disposed under the light emitting diode printed circuit board.

15. The backlight assembly of claim 14, wherein the signal transmitting cable is electrically connected to the light emitting diode driving board connector with the first end, comprises a first bending portion at the through-hole of the bottom plate, comprises a second bending portion at an edge of the light emitting diode printed circuit board, and is connected to the light emitting diode printed circuit board connector with the second end.

16. The backlight assembly of claim 15, wherein the light emitting diode driving board is combined with a shield, the shield comprising a first fixing structure disposed on the bottom plate and a second fixing structure disposed on the lateral part.

17. The backlight assembly of claim 16 wherein the first fixing structure of the shield is disposed the bottom plate from a different direction from which the second fixing structure of the shield is disposed on the lateral part.

18. The backlight assembly of claim 17, wherein the lateral part comprises a vertical plate on which a penetration hole is disposed and wherein the second fixing structure of the shield is disposed on an installation bend, and the penetration hole and the second fixing structure are combined with each other by a fastener inserted from outside the vertical plate.

19. The backlight assembly of claim 16, wherein the first fixing structure of the shield is disposed on the bottom plate in the same direction the second fixing structure of the shield is disposed on the lateral part.

20. The backlight assembly of claim 19, wherein the lateral part comprises a vertical plate from which a bend protrudes, the bend comprising a penetration hole fixed to the second fixing structure of the shield with a fastener, the fastener inserted to the penetration hole and the second fixing structure beyond the bottom plate.

21. The backlight assembly of claim 1, wherein the lateral space is surrounded by a slope connected to the bottom plate, a flat plate outwardly connected to the slope, and a vertical plate vertically connected to the flat plate, wherein the light emitting diode driving board is disposed on the slope.

22. The backlight assembly of claim 1, wherein the lateral part comprises a slope connected to the bottom plate, a flat plate outwardly connected to the slope, and a vertical plate vertically connected to the flat plate, the lateral part comprising a lateral space, wherein the light emitting diode driving board extends from the vertical plate toward the flat plate.

* * * * *